US008667376B2

(12) United States Patent
Kamiya

(10) Patent No.: US 8,667,376 B2
(45) Date of Patent: Mar. 4, 2014

(54) DECODING DEVICE, DATA COMMUNICATION APPARATUS HAVING THE DECODER DEVICE, AND DATA MEMORY

(75) Inventor: Norifumi Kamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 381 days.

(21) Appl. No.: 13/119,251

(22) PCT Filed: Nov. 6, 2009

(86) PCT No.: PCT/JP2009/068980
§ 371 (c)(1),
(2), (4) Date: Mar. 16, 2011

(87) PCT Pub. No.: WO2010/053152
PCT Pub. Date: May 14, 2010

(65) Prior Publication Data
US 2011/0219286 A1    Sep. 8, 2011

(30) Foreign Application Priority Data

Nov. 7, 2008 (JP) .................................. 2008-286458

(51) Int. Cl.
*H03M 13/00* (2006.01)
(52) U.S. Cl.
USPC .......................................... 714/781; 714/758
(58) Field of Classification Search
USPC ................................................ 714/758, 781
See application file for complete search history.

(56) References Cited

U.S. PATENT DOCUMENTS

| 7,937,648 B2 | 5/2011 | Yokokawa |
| 8,266,493 B1 * | 9/2012 | Abbaszadeh et al. .......... 714/752 |
| 8,281,205 B2 | 10/2012 | Yokokawa |

FOREIGN PATENT DOCUMENTS

| JP | 2006191246 A | 7/2006 |
| JP | 2007089064 A | 4/2007 |
| JP | 2007-174027 A | 7/2007 |
| JP | 2009-27302 A | 2/2009 |
| JP | 2009-100423 A | 5/2009 |

OTHER PUBLICATIONS

International Search Report for PCT/JP2009/068980 mailed Feb. 2, 2010.
R G. Gallager, "Low-Density Parity-Check Codes", IEEE Transactions on Information Theory, Jan. 1962, pp. 21-28.
D. J. C. Mackay, "Good Error-Correcting Codes Based on Very Sparse Matrices", IEEE Transactions on Information Theory, vol. 45, No. 2, Mar. 1999, pp. 399-431.
E. Sharon et al., "Efficient Serial Message-Passing Schedules for LDPC Decoding", IEEE Transactions on Information Theory, vol. 53, No. 11, Nov. 2007, pp. 4076-4091.
E. Yeo et al., "High Throughput Low-Density Parity-Check Decoder Architectures", IEEE Global Telecommunications Conference, Nov. 2001, pp. 3019-3024.

(Continued)

*Primary Examiner* — Joseph D Torres
(74) *Attorney, Agent, or Firm* — Sughrue Mion, PLLC

(57) ABSTRACT

A decoding device comprises two check node processing devices of feedback shift register type, each of which node processing includes a plurality of registers and a plurality of comparator circuits. A multiplexer and a demultiplexer switch between the two check node processing devices, and a memory holds the two sorts of data. The comparator circuits are interposed between registers of the check node processing device.

7 Claims, 14 Drawing Sheets

(56) References Cited

OTHER PUBLICATIONS

N. Kamiya et al., "Design of High-Rate QC-LDPC Encoder/Decoder for Microwave Radio Systems", IEEE Global Telecommunications Conference 2007, GLOBECOM '07, Nov. 2007, pp. 1744-1748.

Kuang-Hao Lin et al., "Architecture of the Modified Block Type Low-density Parity-Check Code Decoding Design", 2007 6th International Conference on Information, Communications & Signal Processing, Dec. 2007.

Japanese Office Action for JP Application No. 2010-536797 mailed on Aug. 13, 2013 with Partial English Translation.

* cited by examiner

FIG. 12

| ADDRESS | DATA | | | | | | |
|---|---|---|---|---|---|---|---|
| 0 | $F_0$ | $F_m$ | ..... | $F_{(n-1)m}$ | $q_0$ | $q_m$ | ..... | $q_{(n-1)m}$ |
| 1 | $F_1$ | $F_{m+1}$ | ..... | $F_{(n-1)m+1}$ | $q_1$ | $q_{m+1}$ | ..... | $q_{(n-1)m+1}$ |
| 2 | $F_2$ | $F_{m+2}$ | ..... | $F_{(n-1)m+2}$ | $q_2$ | $q_{m+2}$ | ..... | $q_{(n-1)m+2}$ |
| ⋮ | ⋮ | ⋮ | | ⋮ | ⋮ | ⋮ | | ⋮ |
| m-1 | $F_{m-1}$ | $F_{2m-1}$ | ..... | $F_{nm-1}$ | $q_{m-1}$ | $q_{2m-1}$ | ..... | $q_{nm-1}$ |

DECODING DEVICE, DATA COMMUNICATION APPARATUS HAVING THE DECODER DEVICE, AND DATA MEMORY

CROSS-REFERENCE TO RELATED APPLICATIONS

This application is the National Phase of PCT/JP2009/068980, filed Nov. 6, 2009, which claims priority rights pertaining to JP patent Application No. 2008-286458 filed on Nov. 7, 2008. The entire disclosure of the above patent application is incorporated herein by reference thereto.

TECHNICAL FIELD

This invention relates to a decoding device that decodes a quasi-cyclic low density parity check code in an error correction encoding system, and outputs an estimated transmission bit sequence as a decoded result. More particularly, it relates to a system and a circuit that decodes for block error correction in which an information sequence is segmented into a plurality of blocks each of the same length and in which a redundancy sequence is independently annexed to each resulting block. Still more particularly, it relates to a decoding device that decodes a low density parity check code, particularly of the quasi-cyclic type.

BACKGROUND

In these days, in a satellite communication system or in a mobile communication system, error correction encoding techniques having a high encoding gain is being introduced in order to meet system requirements, such as low required power or reduction in the antenna size.

The low density parity check code has been known as an error correction code having an extremely high encoding gain, and hence an attempt is being made to introduce into the above mentioned communication systems of various configurations and storage unit such as magnetic recording.

The low density parity check code is not indicative simply of a single specified error correction code, but is a global appellation of error correction codes featured by a sparse check matrix, i.e., a matrix whose elements are mostly 0 and whose elements 1 are extremely few.

The low density parity check code is featured by the fact that, with its use, it is possible to construct an error correction encoding system having an extremely high encoding gain which is extremely close to the theoretical limit. This is made possible by the use of an iterative decoding system, such as sum-product, min-sum algorithm, etc., subject to selection of a sparse check matrix, Among technical problems relevant to the decoding system of the low density parity check code, there is such a problem that larger numbers of random access memories (RAMs) are needed for retention of intermediate data temporarily generated in the course of the decoding processing.

In the decoding processing, the above intermediate data are iteratively updated. After a sufficient number of iterations, the transmission data are determined based on the plus or minus sign of data calculated from the intermediate data. The above processing of updating the intermediate data uses the same number of the intermediate data as the Hamming weight of the row vector of the check matrix, from one such row vector to another. Thus, for high-speed processing, it is necessary to refer to a larger number of data at the same time. It is thus necessary to use a larger number of random access memories (RAMs) and to segment the intermediate data in order for the RAMs to hold the segmented intermediate data.

In particular, in the low density parity check code of a high encoding rate, the Hamming weight of the row vector has a larger value, so that a correspondingly larger number of RAMs are required. On the other hand, the size of each RAM is determined by the check matrix of the code used and is not necessarily coincident with the size of the RAM provided by the apparatus on which the decoding device is implemented. Hence, there are also occasions where an increase in the number of RAMs leads to an increased storage capacity of the RAMs.

A conventional example technique relevant to the decoding device for the low density parity check code will now be described. (See Non-Patent Document 3). In the following, a matrix H is an r-row by n-column block matrix, where n is an integer not smaller than 1 and r is a positive integer smaller than n, as indicated by the following equation [Mathematical Expression 1] and each component of the matrix is a block matrix which is an m by m cyclic permutation matrix or a zero-matrix, where m is a positive integer.

$$H = \begin{pmatrix} I_{0,0} & I_{0,1} & I_{0,2} & \ldots & I_{0,n-1} \\ I_{1,0} & I_{1,1} & I_{1,2} & \ldots & I_{1,n-1} \\ \vdots & \vdots & \vdots & & \vdots \\ \vdots & \vdots & \vdots & & \vdots \\ I_{r-1,0} & I_{r-1,1} & I_{r-1,2} & \ldots & I_{r-1,n-1} \end{pmatrix}$$

[Mathematical Expression 1]

In the above equation [Mathematical Expression 1], $I_{i,j}$ denotes an m by m cyclic permutation matrix or zero matrix, where i is an integer from 0 to r−1 and j is an integer from 0 to n−1. However, in the following description, $I_{i,j}$ is taken to denote an m by m cyclic permutation matrix, for simplicity of explanation.

For a case in which, for a given component (i, j) in which $I_{i,j}$ stands for a zero matrix, the basic operation is the same. The low density parity check code, which uses the matrix H of the equation [Mathematical Expression 1] as the check matrix, is specifically termed a quasi cyclic low density parity check code.

(a) and (b) of FIG. 7 each depict a block diagram of a decoding device of the conventional technique for the quasi cyclic low density parity check code. The decoding device includes a set of memories that hold the intermediate data, termed messages, generated in the course of the decoding processing. In addition, the decoding device includes a check node processing circuit for updating the messages, an addition unit and a delay circuit.

Data encoded in accordance with the quasi cyclic low density parity check code are sent over a communication channel and become inputs $F_0, F_1, \ldots, F_{N-1}$ of the decoding device, where N=mn. A bit sequence, indicating the plus or minus sign of the data held by the memories and updated, is output from the decoding device as being a result of decoding.

A method as well as a device for decoding by the conventional technique will now be described with reference to (a) and (b) of FIG. 7. It is observed that (b) of FIG. 7 is ones obtained by making the processing by the decoding device of (a) of FIG. 7 into a parallel processing, with the number of the parallel circuits being two. As a matter of the principle, the circuit shown in (b) of FIG. 7 is equivalent to that of (a) of FIG. 7. The following description will be made essentially with reference to (a) of FIG. 7.

Referring to (a) of FIG. 7, an m-number of data is stored in each of the memories (0), (1), ..., (n−1), so that a total of mn data $Z_0, Z_1, \ldots, Z_{N-1}$ are stored. The initial values of the data $Z_0, Z_1, \ldots, Z_{N-1}$ are input data $F_0, F_1, \ldots, F_{N-1}$ to the decoding device, which input data are output data of the communication channel(s). These data are sequentially updated in the course of the processing for decoding which will now be described.

From the data $Z_u$, where u is an integer from 0 to N−1, data $L_{u \leftarrow v}$, as held by a memory (L) at the lower-most side of (a) of FIG. 7, where v is an integer from 0 to R−1, with R=mr, is subtracted, as indicated by the equation [Mathematical Expression 2] to yield data $Z_{u \rightarrow v}$.

[mathmatical Expression 2]

$$Z_{u \rightarrow v} = Z_u - L_{u \leftarrow v} \qquad \text{[Mathematical Expression 2]}$$

The data $Z_{u \rightarrow v}$ is delivered to a delay circuit as well as to a check node processing circuit, which the check node processing circuit performs the processing indicated by the equation [Mathematical Expression 3].

It is observed that, in the equation [Mathematical Expression 3], B(v) denotes a position in the check matrix where an element in a with row vector becomes 1, and that sgn(Z)=−1 if the value of Z is minus, and =+1 otherwise.

$$L'_{u \leftarrow v} = \prod_{\substack{u' \in B(v) \\ u' \neq u}} \text{sgn}(Z_{u' \rightarrow v}) \min_{\substack{u' \in B(v) \\ u' \neq u}} |Z_{u' \rightarrow v}| \qquad \text{[Mathematical Expression 3]}$$

It is observed that $L'_{u \leftarrow v}$ as calculated by the equation [Mathematical Expression 3] represents the result of update of the data $L_{u \leftarrow v}$ and is retained by the memory L at the lower most end of FIG. 7. It is the check node processing, indicated by the equation [Mathematical Expression 3], that performs the vital role in the processing for decoding of the low density parity check code.

Assume that $L_v^{(1)}$ and $L_v^{(2)}$ are the smallest and second smallest values in a set of the above data $\{|Z_{u \rightarrow v}| \| u \in B(v)\}$, respectively, and also assume that an element u of B(v) which will give $L_v^{(1)} = |Z_{u \rightarrow v}|$ is $U_{min}$. Also assume that, if $Z_{u \rightarrow v}$ is of a negative value and otherwise, $q_{u \rightarrow v}=1$ and =0, respectively. In this case, the data $L'_{u \leftarrow v}$ of the equation 3 [Mathematical Expression 3] may be expressed in accordance with the following equation [Mathematical Expression 4].

$$L'_{u \leftarrow v} = \begin{cases} (-1)^{s_v + q_{u \rightarrow v}} L_v^{(1)} & u \neq u_{min} \\ (-1)^{s_v + q_{u \rightarrow v}} L_v^{(2)} & u = u_{min} \end{cases} \qquad \text{[Mathematical Equation 4]}$$

Meanwhile, in the above Equation [Mathematical Expression 4], $s_v = \Sigma_{u \in B(v)} q_{u \rightarrow v}$ is set.

FIG. 8 depicts a block diagram showing an example formulation of a check node processing circuit 7-2 shown in FIG. 7. The data $Z_{u \rightarrow v}$ is entered for all of elements u in the above set B(v). The data $Z_{u \rightarrow v}$ is already quantized, with the uppermost bit specifying the sign (plus or minus) and with the remaining lower order bits specifying an absolute value.

The upper most bit and the lower order bits are separated from each other. The uppermost bit is delivered to a unit calculating the sign (plus or minus) in the equation [Mathematical Expression 4], whilst the lower order bits are entered to a unit calculating the smallest and second smallest values. The data $L'_{u \leftarrow v}$ shown by the equation [Mathematical Expression 4] is thus obtained.

The above data $L'_{u \leftarrow v}$ is added to the above mentioned data $Z_{u \rightarrow v}$ as obtained through a delay circuit 7-4 of FIG. 7, as indicated by the equation [Mathematical Expression 5] and the result Zu of addition is retained at the same location in the above memory 7-1 of FIG. 7.

[Mathmatical Expression 5]

$$Z_u = Z_{u \rightarrow v} + L'_{u \leftarrow v} \qquad \text{[Mathematical Expression 5]}$$

The above described processing is carried out in the sequence of v=0, 1, ..., R−1, whereby data in the memory is updated.

The foregoing represents a single decoding processing operation in the iterative decoding. The variable v specifies a with row vector of the check matrix, as described above. By carrying out the processing for the total of the row vectors, one round of decoding processing may come to a close. If, after iterating a sufficient number of the decoding processing operations, the value of $Z_u$ is negative, the result of the decoding of the received data Fn is set to 1 and, if otherwise, the result of the decoding is set to 0. The processing for decoding then comes to a close.

Thus, in the processing of decoding the low density parity check code, described above, it is necessary to provide a memory for storage of the data $Z_u$, as the estimated information of the transmission bit sequence, and another memory for storage of the data $L_{u \rightarrow v}$, which corresponds to the update hysteresis of the data $Z_u$, as the estimated information of the transmission bit sequence.

For enabling efficient decoding, it is necessary to provide data $Z_u$ for all of the elements u of the set B(v), from one v (=0, 1, ..., R−1) to another, and to deliver the data to the check node processing circuit.

It is thus necessary to access the memory a number of times equal to the number of the elements of B(v) to provide inputs to the check node processing circuit, if the data $Z_u$ are retained at the addresses of a single memory, for example. There are thus raised problems such as time lag until starting the calculations of the equations ([Mathematical Expression 4] or [Mathematical Expression 3]) as well as increased complexity in address generation.

On the other hand, if the data $Z_u$ are retained not in the single memory but at the same address of a plurality of segmented memories, the above mentioned problem of the time lag may be overcome. In the case of the quasi cyclic low density parity check code having the check matrix of the equation [Mathematical Expression 1], n-number of memories are provided, and data $Z_{jm+k}$ is retained at a kth address of a memory (j), where j denotes an integer from 0 to n−1 and k denotes an integer from 0 to m−1, as shown in (a) of FIG. 7. In this case, it is possible to provide data necessary for delivery to the check node processing circuit by accessing each memory only once. However, a problem then arises that a large number of memories need to be used.

In connection with reduction in the number of random-accessible memories, there is known a method in which the memory (L) at the lower end of FIG. 7 representing the conventional technique is dispensed with and the subtraction of the data $L_{u \leftarrow v}$ in the equation [Mathematical Expression 2] is omitted. See Non-Patent Document 4.

The formulation of a decoding device by this technique is shown in FIG. 9. The formulation is truly effective in reducing the circuit size. However, it is still necessary to use a larger number of RAMs for storing data $Z_u$. In addition, since the subtraction of the data $L_{u \leftarrow v}$ is not carried out, bit errors are left over in an output of the processing device, thus offering a problem such as possible occurrence of deteriorating in the decoding characteristic.

There is also known a solution in which larger numbers of shift registers are used to avoid the use of RAMs to provide a formulation that is simple in structure and that lends itself to a high-speed operation. See, for example, the Patent Document 1. The formulation is, however, beset with a problem that the circuit size is increased in case the code length N is on the order of thousands of bits or more or in case there are many redundant bits and hence the coding rate is extremely low.

[Patent Document 1] JP Patent Kokai Publication No. JP-P2007-89064A

[Non-Patent Document 1] "Low Density Parity-Check Codes", Robert Gallager, published by IEEE Transactions on Information Theory pp. 21 to 28, January 1962

[Non-Patent Document 2] "Good Error Correcting Codes Based on Very Sparse Matrices", D. J. C. Mackay, published by IEEE Transactions on Information Theory, pp. 399-431, March 1999

[Non-Patent Document 3] "Efficient Serial Message-Passing Schedule for LDPC Decoding", Eran Sharon, Simon Litsyn and Jacob Goldberger, published by IEEE Transactions on Information Theory, pp. 4076-4091, November 2007

[Non-Patent Document 4] "High Throughput Low-Density Parity-Check Decoder Architecture", E. Yeo, P. Pakzad, B. Nikolic and V. Anantharam, 2001, published by IEEE Global Telecommunications Conference, pp. 3019-3024, November 2001

SUMMARY

The entire disclosures of the above Patent Document 1 and Non-Patent Documents 1 to 4 are incorporated herein by reference thereto.
The following analysis is given from the view of the present invention.
In the conventional decoding techniques for the low density parity check code, it is necessary to store/update intermediate data generated during calculations for the processing of decoding and it is moreover necessary to refer to larger numbers of the intermediate data during each processing. And thus a problem is raised that the intermediate data need to be segmented and stored in this state in larger numbers of random accessible memories.

The size required of the memories are determined by the check matrices of the code used, and is not necessarily coincident with the size of memories (random access memories RAM) provided on the apparatus on which the decoder is implemented. Hence, the problem of necessitating larger numbers of memories also leads to increased storage capacities.

If simply the intermediate data are collectively stored in a single memory or in a few memories, it is necessary to carry out readout from the memory or memories a plural number of times to collect data needed for check node processing which represents the nucleus of the processing of decoding. The same applies for a case of writing the updated intermediate data in the memory or memories. This may lead to prolonged time for decoding for processing and significant delay time, while lowering the processing speed.

In particular, in the low density parity check code of a high coding rate, the value of the Hamming weight of the row vector is larger, so that larger amounts of the intermediate data need to be referenced in one processing. This may lead to prolonged time of processing of decoding and to significant delay time, which, in turn, can not lead to a breakthrough solution of the problem(s).

In light of the above points of the related art, it is an object of the present invention to provide a decoding device for the quasi cyclic low density parity check code in which the number of the random access memories (RAMs) may be appreciably reduced without attendant increase in the decoding time or in time delay.

The present invention provides a decoding device that decodes a quasi cyclic low density parity check code of an error correction coding system, and outputs an estimated transmission bit sequence as a decoded result. The decoding device comprises: an information memory that stores at least estimated information of a transmission bit sequence, and a set of two feedback shift register type check node processing devices each including a feedback register made up of a plurality of registers interconnected to form a loop. The feedback shift register type check node processing devices each input the estimated information and generate a message to update the input estimated information while outputting the message generated. The decoding device also comprises a multiplexer selecting one of the check node processing devices that inputs the estimated information, and a demultiplexer selecting another one of the check node processing devices that outputs the message. The decoding device further comprises an addition circuit that updates the estimated information based on the message output from the check node processing device selected by the demultiplexer and that outputs the estimated information updated. The check node processing device includes a permutation circuit that permutates the estimated information, and a plurality of comparator circuits. Each comparator circuit selects, out of two data saved in the registers of the check node processing device and data output by the estimated information, a smallest value data and a second smallest value data, and saves the data selected in registers of a next stage. Each of the comparator circuits is interposed between the registers of the check node processing device.

The decoding device of the present invention does not have an n-number of memories adapted for holding a sum of N (=mn) data $Z_0, Z_1, \ldots, Z_{N-1}$ generated from one column vector of the check matrix H shown in the equation [Mathematical Expression 1] to another. The decoding device also does not have a check node processing device that performs the processing of comparing an n-number of input data. Instead, the decoding device of the present invention has one memory or a few memories, such as RAM(s), and a feedback shift register type check node processing device. This feedback shift register type check node processing device includes a plurality of registers and a plurality of comparator circuits each made up of two two-input comparators. These registers and comparator circuits are interconnected to form a loop. These may thus be provided a decoder configuration in which the number of the memories used may be drastically reduced without increasing the processing speed/delay time/circuit size. The present invention yield beneficial effects such as reduction in the storage capacity/circuit size as well as reduction in power consumption during the decoding operation.

BRIEF DESCRIPTION OF THE DRAWINGS

FIG. 12 is a schematic view showing an example of an initial state of a memory 1-1.

PREFERRED MODES

Figure 1:
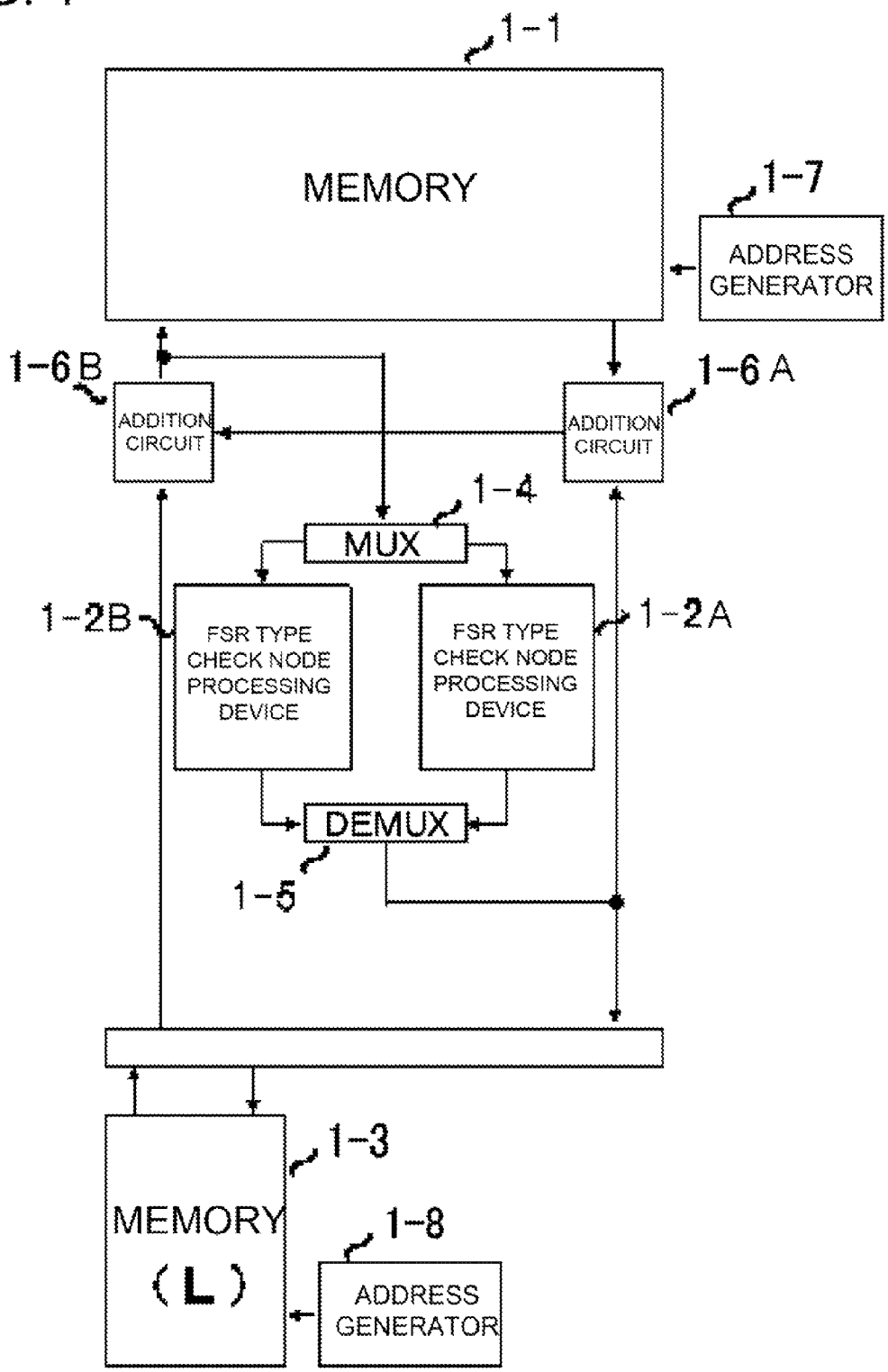
FIG. 1 is a block diagram of a decoding device showing an exemplary embodiment of the present invention.

A decoding device according to an exemplary embodiment of the present invention decodes a quasi cyclic low density parity check code of an error correction encoding system, and outputs an estimated transmission bit sequence as a decoded result. The decoder includes an information memory that stores at least the estimated information of a transmission bit sequence, and a set of two feedback shift register type check node processing devices. Each feedback shift register type check node processing device includes a feedback register made up of a plurality of registers interconnected to form a loop. Each feedback shift register type check node processing device inputs the estimated information and generates a message to update the input estimated information so as to output the message generated. The decoder also includes a multiplexer selecting one of the check node processing devices that inputs the estimated information, and a demultiplexer selecting another one of the check node processing devices that outputs the message. The decoder further includes an addition circuit that updates the estimated information, based on the message output from the check node processing device, selected by the demultiplexer, so as to output the estimated information updated. The check node processing device further includes a permutation circuit that permutates the estimated information, and a plurality of comparator circuits. Each comparator circuit selects, out of two data saved in the registers of the check node processing device and data output by the estimated information, a smallest value data and a second smallest value data, and saves the data selected in the registers of the next stage. The comparator circuits is (are) interposed between the registers of the check node processing device.

The decoding device according to the present invention further includes a hysteresis memory that stores the update hysteresis of the estimated information. The addition circuit updates the estimated information based on the message output from the check node processing device as selected by the demultiplexer, and on the update hysteresis, to output the estimated information updated. The message output from the check node processing device is temporarily stored in a hysteresis memory as an update hysteresis.

In the decoding device according to the present invention, the number of the registers of the check node processing device is set so as to be equal to the size of a cyclic matrix of elements that form the check matrix of the quasi cyclic low density parity check code.

In the decoding device according to the present invention, assuming that one of the two check node processing devices is L, with the other of the two check node processing devices being R, and if the multiplexer that selects the check node processing device inputting the estimated information of the transmission bit sequence has selected the check node processing device L, the demultiplexer that selects the check node processing device outputting the message selects the check node processing device R. If the multiplexer selects the check node processing device R, the demultiplexer may select the check node processing device L.

In the decoding device according to the present invention, there may be provided a plurality of the information memories. Each of the information memories storing the estimated information of the transmission bit sequence includes a clock counter that operates in synchronism with operating readout clocks from the information memory and that is reset to 0 each time a count value reaches a preset positive value. Each of the information memories takes an address coincident with the count value of the clock counter to be a readout address. The operations of the multiplexer and the demultiplexer are changed over at a stage where address generation based on the count values of the clock counter has made a round.

A data communication apparatus of the present invention may include the above defined decoding device.

The data storage apparatus of the present invention may include the above defined decoding device.

It is sufficient that the various components of the present invention are formed such as to implement the respective functions. For example, these components of the present invention may be implemented by dedicated hardware demonstrating preset functions, a data processor that performs preset functions by a computer program, or by arbitrary combinations thereof.

Further, it is unnecessary for various components of the present invention to be respective independent entities. Viz., it is sufficient that each component be formed as a plurality of members or a part of another component, while it is also sufficient that a part of a component is overlapped with a part of another component.

In the following, one exemplary embodiment is described with reference to the drawings.

[Explanation of Formulation]

A formulation of a decoding device of the present exemplary embodiment is shown in the block diagram of FIG. 1. The decoding device of the present exemplary embodiment may be used for decoding a quasi cyclic low density parity check code having a check matrix of the equation [mathematical expression 1]. The decoding device includes two sets of memories (storage units) 1-1, 1-3 and two check node processing circuits of the feedback shift register (FSR) type 1-2A, 1-2B, as shown in FIG. 1. The decoding device also includes a multiplexer 1-4 and a demultiplexer 1-5 for switching over between the check node processing circuits 1-2A, 1-2B, an addition circuit 1-6 and two address generators 1-7 and 1-8.

A received data sequence, an output of a communication channel, is labeled $F_0, F_1, \ldots, F_{N-1}$. Assume that each symbol $F_i$ of the received data sequence is represented by b' bits, where i denotes an integer between 0 and N−1 and b' is a positive number, the memory 1-1 is in need of the storage capacity of (b+r) N bits, at the maximum, where b is a positive number not less than b'.

The memory 1-1 is essentially an information memory for storing the estimated information of the transmission bit sequence. On the other hand, the memory (L) 1-3 of FIG. 1 is in need of a storage capacity of $(2b-1+\log_2 n)mr$ bits at the maximum. It is observed that the subdecimal part of $\log_2 n$ is rounded up. The memory (L)1-3 is a hysteresis memory that retains the update information of the estimated information of the transmission bit sequence.

Figure 2:
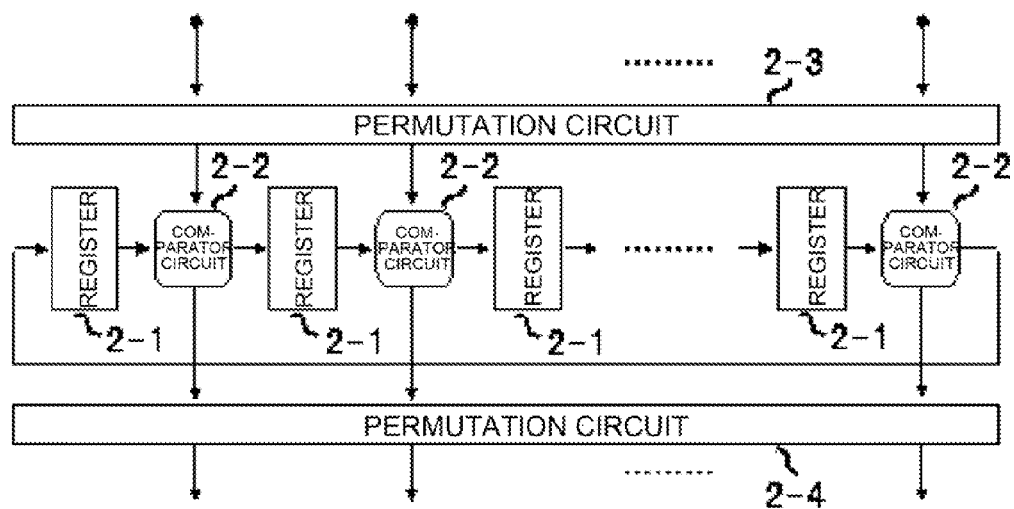
FIG. 2 is a block diagram showing an example of a check node processing device shown in FIG. 1.

FIG. 2 depicts a block diagram showing an Example of the FSR type check node processing circuit 1-2A or 1-2B. Referring to FIG. 2, the check node processing circuit is made up of an m-number each of registers 2-1 and comparator circuits 2-2, and two permutation circuits 2-3, 2-4.

Each register has a bit size of $(2b-1+\log_2 n)$ bits, at the maximum, composed of two data corresponding to $L_v^{(1)}$ and $L_v^{(2)}$ of the above equation [mathematical expression 4], each being b-1 bits, a pointer of $\log_2 n$ bits at the maximum, equivalent to $u_{min}$ in the above equation [mathematical expression 4], and 1 bit corresponding to $s_v$ in the above equation [mathematical expression 4].

An n-number of data, each composed of an nm number of data, each of which is formed by b bits, are entered in a parallel configuration to the check node processing devices during m time units. During this time, the data in the registers are sequentially updated. When the inputting has come to a close, the data retained by the register are output sequentially.

The permutation circuit 2-3 segments and permutates (re-arrays) input data to distribute (allocate) the data to the comparator circuits arranged between the registers. The following is the manner of re-arraying and distributing the data in dependence upon the selection of the cyclic permutation matrices as components (elements) of the check matrix ([mathematical expression 1]). For convenience, the m-number of the registers in FIG. 2 are labeled 0, 1, 2, . . . , m–1, looking from right to left, for distinction from the above mentioned n-number of inputs which are labeled 0, 1, 2, . . . , n–1.

An ith row block of the check matrix is $(I_{i,0}, I_{i,1}, \ldots, I_{i,n-1})$, where i is an integer between 0 and r–1. Assume that the position of a sole non-zero element in a 0th row vector in the m by m cyclic permutation matrix $I_{i,j}$ is $h_{i,j}$, where j is an integer between 0 and m–1 and i is an integer between 0 and m–1. The input side permutation circuit 2-3 is connected so that inputs j (an integer between 0 and m–1) will be delivered to the comparator circuits arranged between the registers $m-h_{i,j}$ and the registers $m-h_{i,j}-1$. For the permutation circuit 2-4, provided on the output side, the method for connection is the same as that for the input side permutation circuit 2-3.

Figure 3:
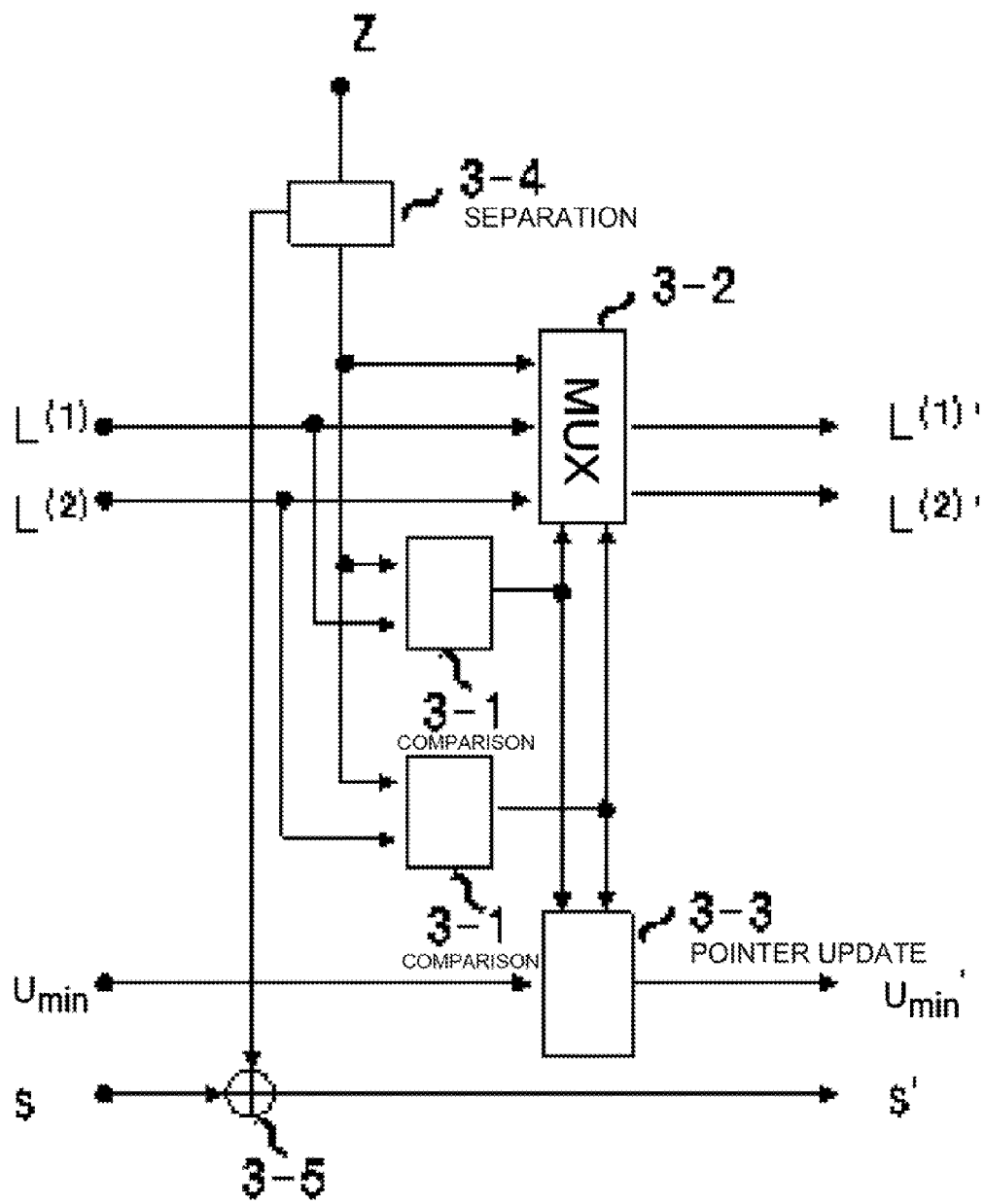
FIG. 3 is a block diagram showing an example of a comparator circuit shown in FIG. 2.

The comparator circuit of FIG. 3 includes a comparator 3-1 that compares the large-small relationship between the values of two input data to output the smaller one of the two data. The comparator circuit also includes a multiplexer 3-2 for selecting an output, and a pointer update circuit 3-3. The comparator circuit further includes a device 3-4 for separating the input data into an upper most bit and other lower order bits, and an EX-OR circuit 3-5.

The comparator circuit, used in the check node processing device of FIG. 2, is also provided with a function of directly outputting the input data shown in FIG. 3 ($L^{(1)}$, $L^{(2)}$, $u_{min}$ and s). Since this can be implemented by selecting the above input data and the output data of FIG. 3 by the multiplexer, description with reference to the drawings is dispensed with. The data shown in the drawing ($L^{(1)}$, $L^{(2)}$, $u_{min}$ and s) will be explained later in detail.

Figure 4:
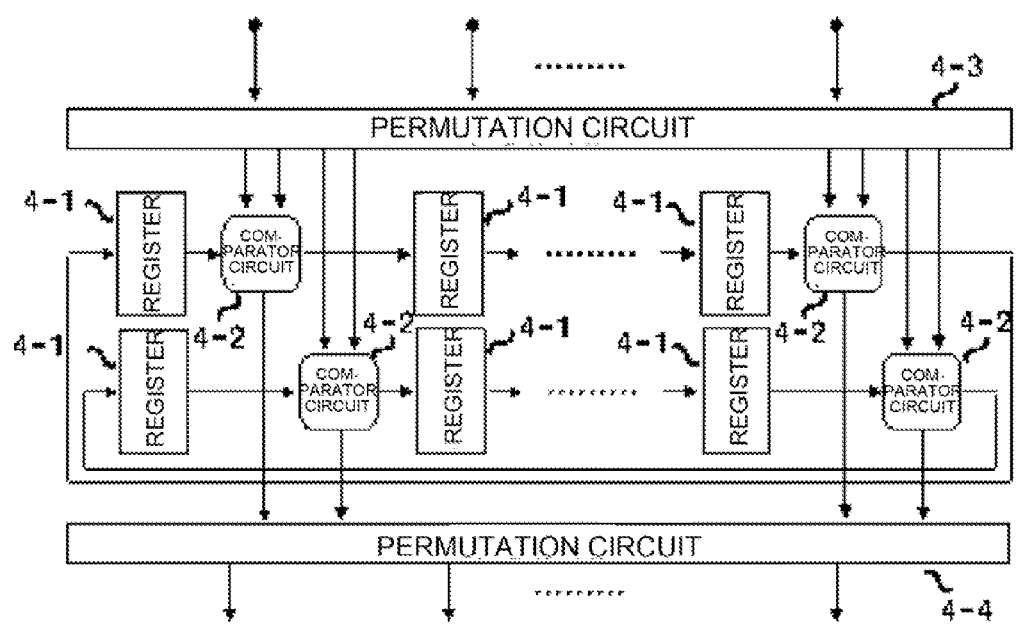
FIG. 4 is a block diagram showing an example of a check node processing device of parallel configuration.

FIG. 4 depicts a block diagram showing an example of a configuration in which two of the check node processing devices of FIG. 2 are arranged in tandem fashion in parallel to each other. Each check node processing device is made up of a plurality of registers 4-1 and a plurality of comparator circuits 4-2, as in FIG. 2. Two permutation circuits 4-3 and 4-4 are associated with the check node processing devices, as in FIG. 2.

The number of the registers is m, as in FIG. 2, however, the number of the comparator circuits is twice as many as that in FIG. 2. In this case, 2n data, each composed of nm b-bit data, are entered in parallel over m/2 time units. The case where the data are arrayed in three or more tiers in parallel is basically the same as the case of transmitting the data in two parallel tiers and hence is not described for simplicity.

Figure 5:
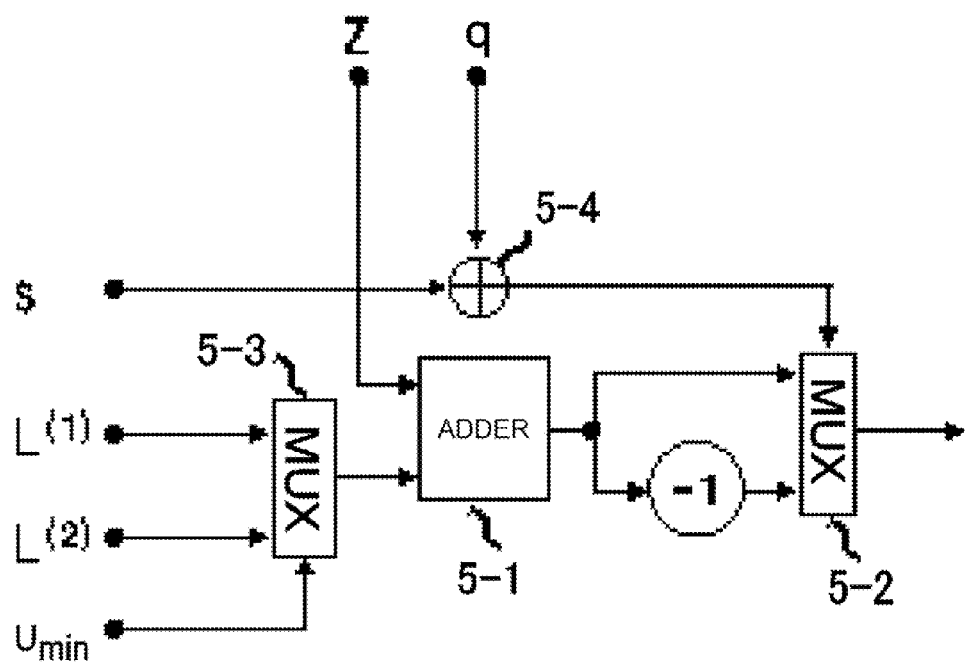
FIG. 5 is a block diagram showing an example of an addition circuit shown in FIG. 2.

FIG. 5 depicts a block diagram showing an example of a formulation of component elements of the addition circuit 1-6 in FIG. 1. The addition circuit 1-6 is comprised of an n-number at the maximum of tiers of the circuits of FIG. 5 arranged in parallel to one another. The circuit of FIG. 5 is mainly composed of an adder 5-1 and multiplexers 5-2, 5-3. Input data are those labeled $L^{(1)}$, $L^{(2)}$, $u_{min}$, s, Z and q.

Of these, the data $L^{(1)}$, $L^{(2)}$, $u_{min}$, and s correspond to the data $L^{(1)}$, $L^{(2)}$, $u_{min}$ and s in FIG. 3, and are coincident with the data output from the check node processing device. The following equation [Mathematical Expression 6] shows the relationship among the above six data and the output Z'.

$$Z' = \begin{cases} Z + (-1)^{s+q}L^{(1)} & u \neq u_{min} \\ Z + (-1)^{s+q}L^{(2)} & u = u_{min} \end{cases} \quad \text{[Mathematical Expression 6]}$$

The bit widths of the data $L^{(1)}$, $L^{(2)}$, $u_{min}$, and s are b–1, b–1, $\log_2 n$ and 1, respectively, totaling at $2b-1+\log_2 n$ bits. The bit widths of Z and q are b and 1, respectively.

If the bit width of the input data q is larger than 1, 1 bit is selected by a predetermined means, not shown. Also, in the equation [mathematical expression 6], u is a predetermined constant. It may be said that the addition circuit is a device that performs the calculations shown in the equation [Mathematical Expression 4] and the equation [Mathematical Expression 5].

Figure 6:
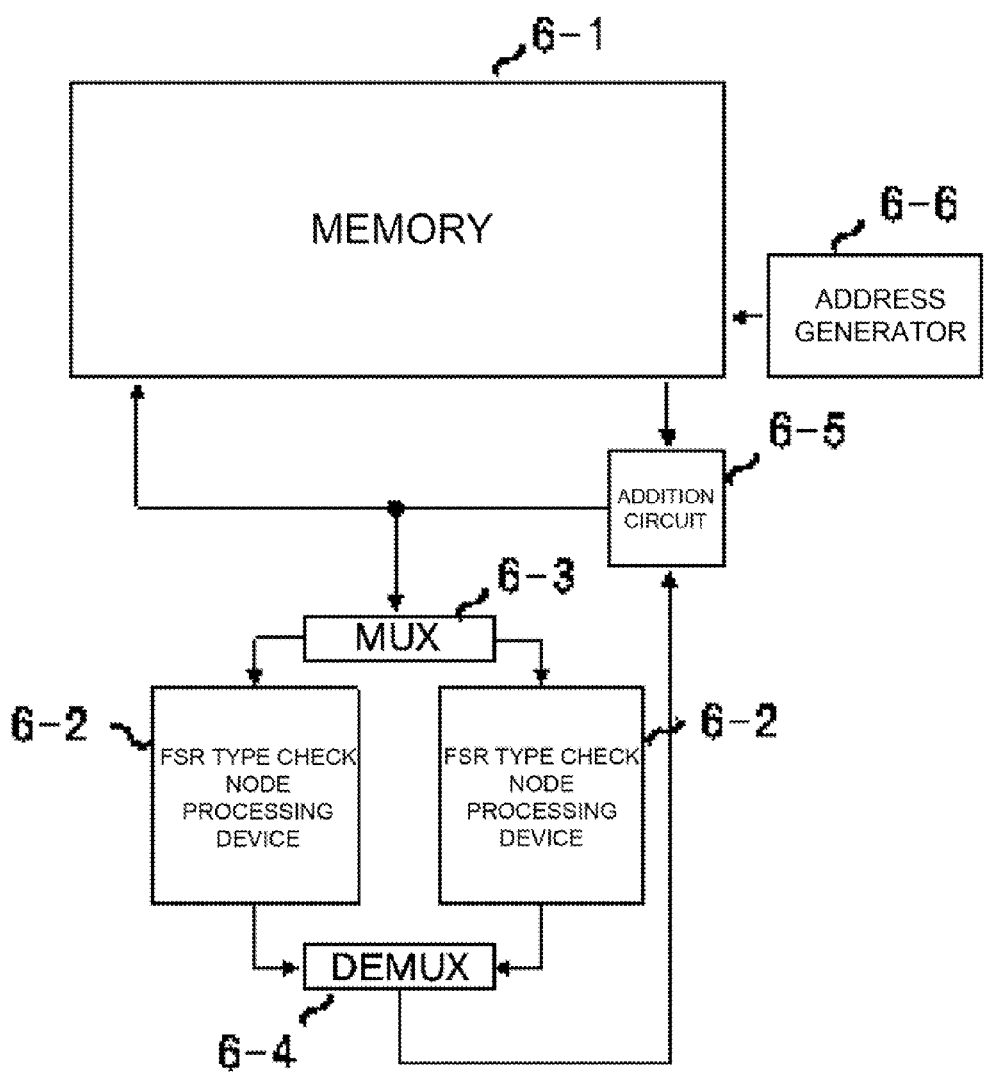
FIG. 6 is a block diagram showing an example of a decoder device according to the present invention, in which a certain memory is removed.
Figure 7:
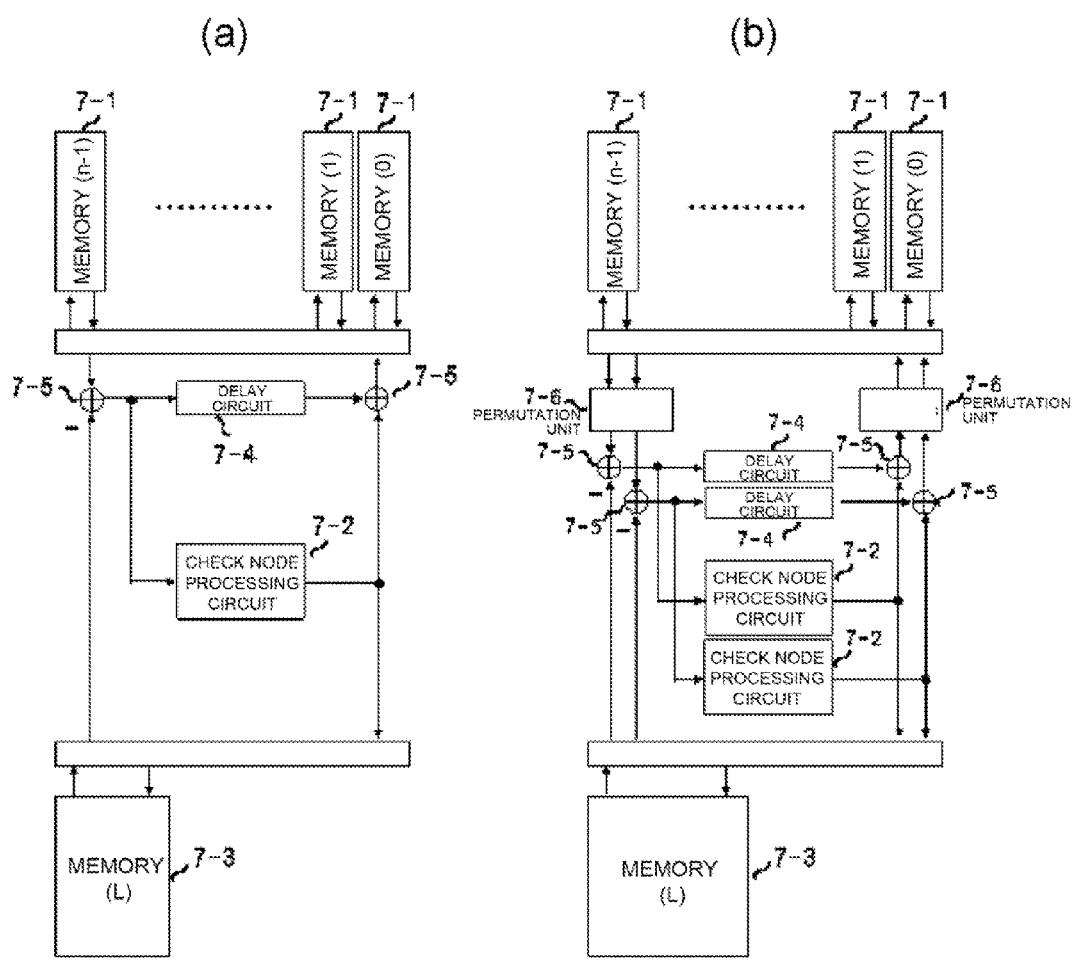
FIG. 7 is a block diagram showing an example of a decoding device of the related art.
Figure 8:
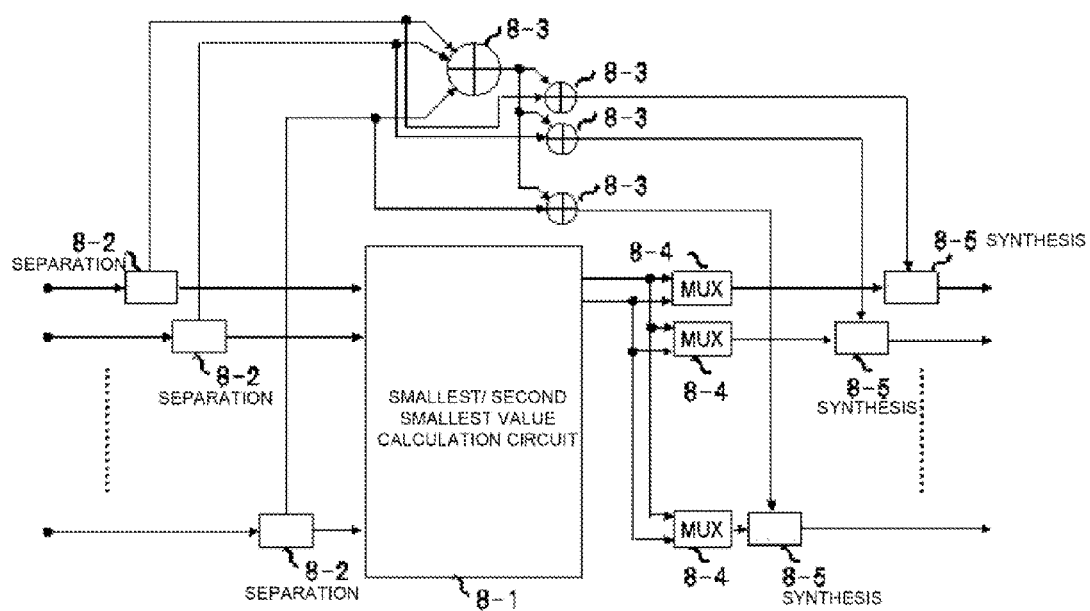
FIG. 8 is a block diagram showing a check node processing device of the related art.
Figure 9:
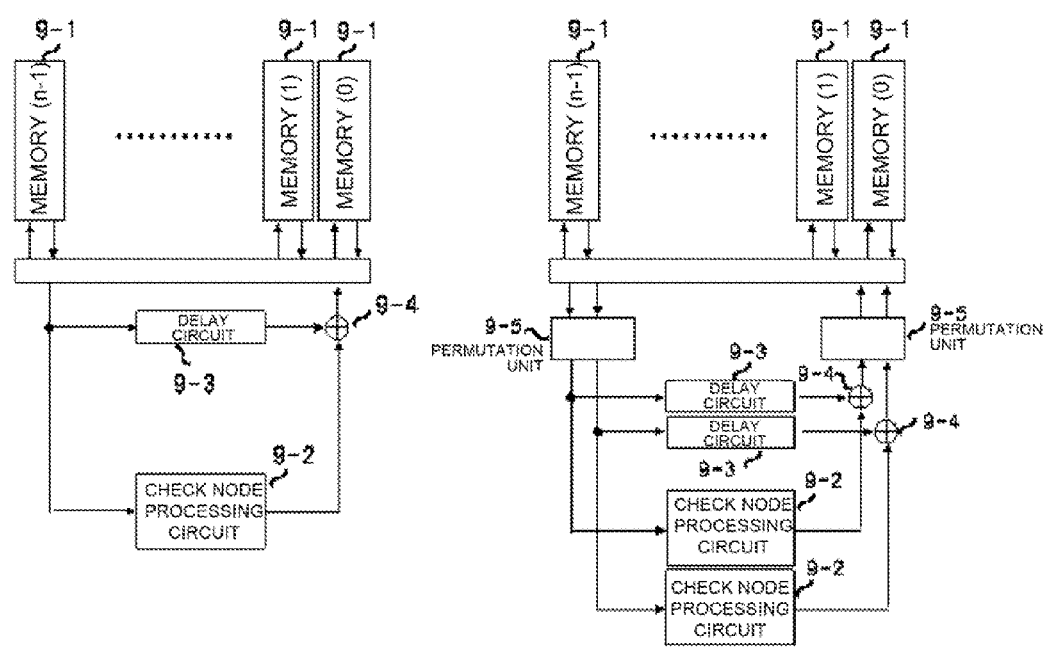
FIG. 9 is a block diagram showing an example of a decoding device of the related art, in which a certain memory is removed.

FIG. 6 shows a decoding device similar to the device shown in FIG. 1 and from which the memory (L) 1-3 has been removed. By not using the memory (L) 1-3, the storage capacity needed is reduced, while the number of the addition circuits may be decreased. In general, the error rate characteristic is deteriorated by reduction in the memory capacity. However, depending on selection of the check matrix H of the equation [Mathematical Expression 1], the deterioration of the error rate characteristic (error correction capability) may be decreased to an extremely small level.

[Explanation of Operation]

Before proceeding to description of the operation of the decoding device of FIG. 1, the principle of the decoding system of the present invention will be described in comparison with the conventional system by taking a simplified example. For simplicity, r, n and m in the check matrix of the equation [Mathematical Expression 1] are set so that r=2 and n=m=3. Viz., the quasi cyclic low density parity check matrix, represented by the following expression [Mathematical Expression 7] is taken as the simplified example for explanation.

[Mathematical Expression 7]

$$\begin{bmatrix} 1 & 0 & 0 & | & 0 & 1 & 0 & | & 0 & 0 & 1 \\ 0 & 1 & 0 & | & 0 & 0 & 1 & | & 1 & 0 & 0 \\ 0 & 0 & 1 & | & 1 & 0 & 0 & | & 0 & 1 & 0 \\ \hline 0 & 0 & 1 & | & 0 & 1 & 0 & | & 1 & 0 & 0 \\ 1 & 0 & 0 & | & 0 & 0 & 1 & | & 0 & 1 & 0 \\ 0 & 1 & 0 & | & 1 & 0 & 0 & | & 0 & 0 & 1 \end{bmatrix}$$

Figure 10:
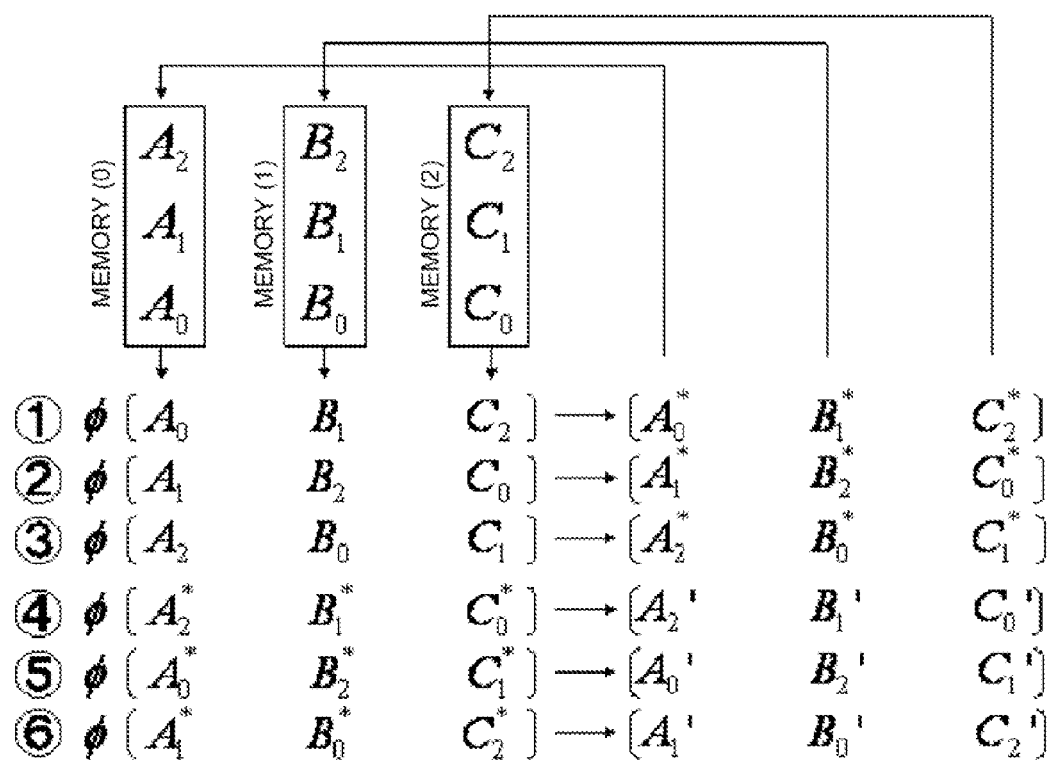
FIG. 10 is a schematic view showing an example of decoding processing according to the related art.

FIG. 10 depicts a block diagram showing schemata of the flow of the decoding processing by a conventional technique.

To stress the contrast with the flow of the decoding process of the present invention and to simplify the description, description of the detailed formulation or processing is dispensed with. In the conventional technique, the three memories (memories (0), (1) and (2)) retain intermediate data, which intermediate data are iteratively updated.

The memory (0) is for 0th to 2nd column vectors, while the memory (1) is for third to fifth column vectors and the memory (2) is for sixth to eighth column vectors. At a time point (i), data $A_0$, $B_1$ and $C_2$ are read out from the memories (0), (1) and (2), respectively.

The order of reading out data from the respective memories is determined by the column vectors of the check matrix. The data stored in a location of each column vector where the element is 1 is read out.

The three data ($A_0$, $B_1$ and $C_2$) as read out are delivered to the check node processing device so as to be updated respectively to ($A_0^*$, $B_1^*$ and $C_2^*$). The update processing is denoted as ø. The updated data are written in the respective memories at the same addresses as those used for readout. In similar manner, at a time point (ii), three data ($A_1$, $B_2$ and $C_0$) are read out/updated/written and, at a time point (iii), three data ($A_2$, $B_0$ and $C_1$) are read out/updated/written.

Then, at a time point (iv), the data ($A_2^*$, $B_1^*$ and $C_0^*$), updated at the time points (i) to (iii), are read out and updated, and so on until the data ($A_0^*$, $B_2^*$ and $C_1^*$) and the data ($A_1^*$, $B_0^*$ and $C_2^*$) are read out/updated/written to complete one round of iterative processing.

The fact that simply reducing the number of the memories leads to prolonged processing time will now be described. The combination of the data at the second address of the memory (0), the data at the first address of the memory (1) and the data at the 0th address of the memory (2) is such a combination that has not appeared at the time points (i) to (iii).

It is now supposed that the three memories are replaced by a single memory which is a combination of these three memories. In this single memory, ($A_0$, $B_1$ and $C_2$), ($A_1$, $B_2$ and $C_0$) and ($A_2$, $B_0$ and $C_1$) are data at the 0th address, first address and the second address, respectively. If with the use of this single memory, the data needed at the time point (iv) are to be provided in order, memory access operations need to be carried out three times, thus causing a delay.

This means that simply combining the memories leads to prolonged processing time. The present invention gives a solution to such inconvenience. Viz., the present invention provides a decoding device which, by using a single substitution memory in which ($A_0$, $B_0$ and $C_0$), ($A_1$, $B_1$ and $C_1$) and ($A_2$, $B_2$ and $C_2$) are data at the 0th address, first address and the second address, respectively, does not lead to increased processing time.

Figure 11:
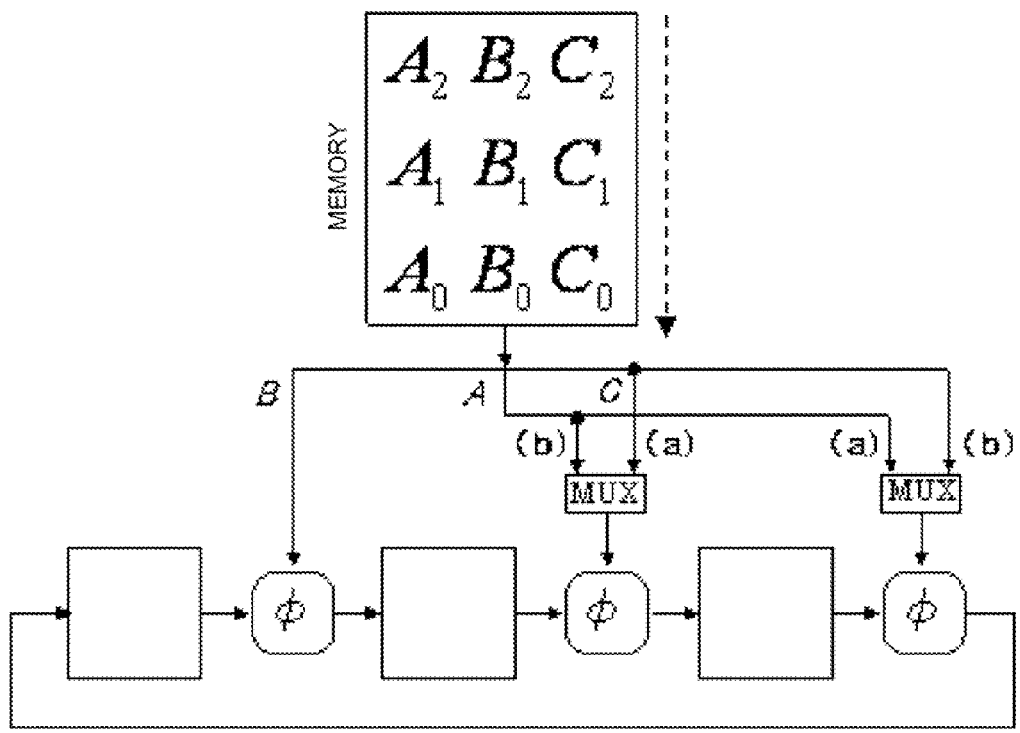
FIG. 11 is a schematic view showing an example of decoding processing according to the present invention.

FIG. 11 depicts a block diagram showing a schemata of the flow of the decoding processing with the quasi cyclic low density parity check code having the check matrix of the equation [mathematical expression 6] according to the present invention. To stress the contrast with the flow of decode processing by the conventional technique and to simplify the description, the detailed formulation or processing is dispensed with.

The block diagram of FIG. 11 shows a check node processing device composed of a single memory, three registers and three comparator circuits (ø), interconnected to form a loop. There are stored ($A_0$, $B_0$ and $C_0$), ($A_1$, $B_1$ and $C_1$) and ($A_2$, $B_2$ and $C_2$) at the 0th, first and second addresses of the memory, respectively. The initial value S of each register is selected so that ø(S, X)=X is established for the processing for comparison ø and for an arbitrary value X.

At a time point (i), data ($A_0$, $B_0$ and $C_0$) are read out from the memory. The data is segmented into three segments such that $A_0$ is entered to the right side comparator circuit, $C_0$ is entered to the mid side comparator circuit and $B_0$ is entered to the left side comparator circuit. It is observed that, during the time as from time point (i) until time point (iii), the sides (a) of the multiplexers MUX are selected.

The respective registers are initialized as above mentioned, such that, after the end of entry of the data, the values retained by the registers are $A_0$, $B_0$ and $C_0$, looking from the left side, as shown. At a time point (ii), $A_1$ is entered to the right side comparator circuit, $C_1$ is entered to the mid side comparator circuit and $B_1$ is entered to the left side comparator circuit. After the end of entry of the data, the values retained by the registers are ø($C_0$, $A_1$), ø($A_0$, $B_1$) and ø($B_0$, $C_1$), looking from the left side, as shown.

At a time point (iii), $A_2$ is entered to the right side comparator circuit, $C_2$ is entered to the mid side comparator circuit and $B_2$ is entered to the left side comparator circuit. After the end of entry of the data, the values retained by the registers are a ø($B_0$, $C_1$ $A_2$), ø ($C_0$, $A_1$, $B_2$) and ø($A_0$, $B_1$, $C_2$), looking from the left side, as shown. In light of the property ø of the processing of comparison calculations, ø(ø(A, B), C)=ø(A, B, C) is valid for arbitrary inputs A, B and C.

At the end of the operation for the time point (iii), the values held by the three registers are coincident with the result of the processing for the time points (i), (ii) and (iii) shown in FIG. 10. It is thus seen that the two processing configurations give the same result. At the time point (iv), the register values are used to update the memories. After initializing the registers, the processing is continued for the time points (iv), (v) and (vi) in the same sequence of operations as that described above.

The data readout sequence is the same as that described above. However, the multiplexers disposed at the pre-stage to the register inputs are set to the sides (b) during the time of (iv), (v) and (vi).

In actuality, it is necessary to update the memory contents, during the time between (iii) and (iv), using the values of the respective registers, as described above. To perform this processing efficiently, the formulation of FIG. 1, employing two check node processing devices, is used. In each check node processing device, shown in FIG. 1, a plurality of registers and a plurality of comparator circuits are interconnected to form a loop, as will be explained subsequently.

In the foregoing, the basic principle of the present invention has been explained using a simplified example. The operation of the decoding device 1 of the present invention will now be described in detail in connection with the quasi cyclic low density parity check code having the check matrix of the expression [Mathematical Expression 1].

It is assumed that the sequence of received data sequence $F_0, F_1, \ldots, F_{N-1}$, as an output of the communication channel, has been obtained at a time point of the start of the processing of decoding, and that the memory 1-1 as well as the memory (L)1-3 are both initialized.

In the following explanation, assume that, as an example formulation of the memory 1-1, the bit width is n (b+r) bits and the number of words is m. Also assume that, as an example of formulation of the memory L(1-3), the bit width is (2b−1+ log$_2$n)m bits and the number of words is r.

Each memory may be segmented into an arbitrary plural number of memory sections, in the direction of the bit width, depending on a demand from a device on which the decoder device is implemented. It is observed that readout/write addresses can be shared even in case the memory is segmented in the bit width direction into an arbitrary plurality of memory sections.

The memory (L)1-3 is initialized by setting the total of data to zero. An example case of initialization of the memory 1-1 is shown in FIG. 12. The bit width of the data Fi in FIG. 12 is b bits, whereas that of q$_i$ is r bits, where i denotes an integer from 0 to nm−1.

In the following, to distinguish between the two check node processing devices, the check node processing device on the left side is labeled 1-2B, while that on the right side is labeled 1-2A, only for convenience sake.

In similar manner, to distinguish between the two addition circuits in FIG. 1, the addition circuit on the left side is labeled 1-6B, while that on the right side is labeled 1-6A, again only for convenience sake. The bit width of each register in the two check node processing devices 1-2A, 1-2B is (2b−1+ log$_2$n) bits at the maximum. The initial values of the registers are determined as follows:

In setting the initial value of the register of the check node processing device 1-2B, the data portion represented by b−1 bits of data of $L_v^{(1)}$, $L_v^{(2)}$, referred to in the [Explanation of Formulation], is to be a maximum value represented by the b−1 bits, with the remaining data portion being set to 0.

On the other hand, the initial value of each register in the check node processing device 1-2A is set to zero. There are cases where the registers of one of the two check node processing devices 1-2A, 1-2B are initialized in the course of the processing of decoding as will be described below. The initialization for this case is in accordance with the method for initialization for the device 1-2B described above. Viz., in starting the processing for decoding, it is only the data in the registers of the check node processing device 1-2A that are initialized to zero in their entirety.

Figure 13:
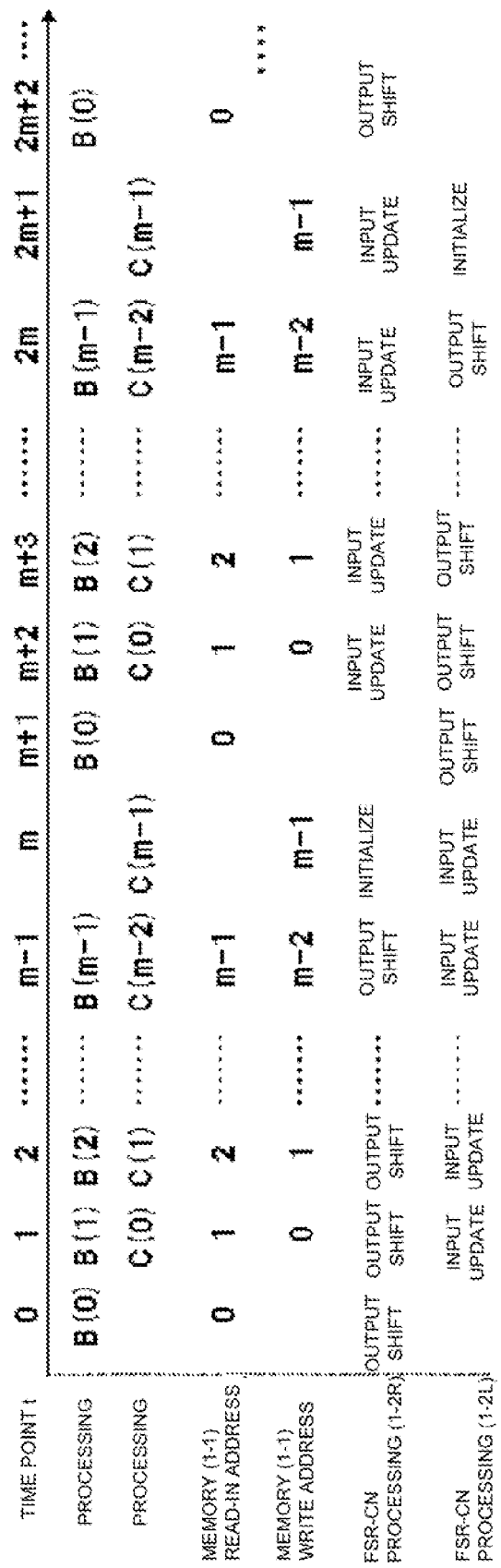
FIG. 13 is a timing chart showing an example of operation of decoding processing.

An example operation of the decoding device of FIG. 1 of the present exemplary embodiment is shown in a time chart of FIG. 13. The following explanation, which is made with reference to FIG. 13, is centered about the processing of updating the data retained in the memory 1-1 and the data retained in the registers of the two check node processing devices. The processing operations, indicated below, are denoted as B(t) and C(t), where t is an integer from 0 to m−1.

B(t): An n-number of data, each made up of b+r bits, are read out from a tth address of the memory 1-1. These data and an n-number of data, each being of 2b−1+ log$_2$n bits, output from the check node processing device 1-2A (or 1-2B) via the demultiplexer 1-5, are entered to the addition circuit 1-6B.

An output of the addition circuit 1-6B and data loaded from an x(t)th address of the memory (L) 1-3 are entered to the addition circuit 1-6A to get an output result of the addition circuit 1-6A. It is observed that x(t) is determined by t and an integer between 0 and r−1 determined in dependence upon the check matrix H of the equation [mathematical expression 1].

C(t): The output result of the addition circuit 1-6L is written in the tth address of the memory 1-1. The output result is also entered via the multiplexer 1-4 to the check node processing device 1-2B or 1-2A to update the data retained in the registers of the check node processing device 1-2B or 1-2A.

In outputting data from the registers of the check node processing device 1-2A or 1-2B, in the above processing of B(t), the data in the registers are simultaneously shifted towards right by one stage. The right most register data are shifted to the left most side. The write operation for the memory (L)1-3 will be explained later on.

Initially, the processing B(0) at a time point t=0 is performed. At this time, data is read from the 0th address of the memory 1-1, as described above, while data retained in the registers of the check node processing device 1-2A is output and shifted. It is observed that the check node processing device is the FSR-CN processing in FIG. 13. The processing B(t) and the processing C(0) are carried out at a time point t=1.

Data is read at this time from the first address of the memory 1-1, while data calculated by the processing B(0) is written at the 0th address. If the above mentioned data are denoted as $(W_0, W_m, \ldots, W_{(n-1)m})$, then the post-write data of the 0th address in FIG. 12 will be $(W_0, W_m, \ldots, W_{(n-1)m}, q_0, q_m, \ldots, q_{(n-1)m})$.

It is observed that $q_{im}$ is r-bit data $q_{im}$ of FIG. 12 on the condition that the one bit at a preset position of the latter data is set to 1 and 0 when $W_{im}$ is negative and otherwise, respectively. It is also observed that i is an integer from 0 to n−1.

The above data $(W_0, W_m, \ldots, W_{(n-1)m}, q_0, q_m, \ldots, q_{(n-1)m})$ is entered to the check node processing device 1-2B to update the data retained by the registers.

The registers of the check node processing device 1-2A perform the operation of outputting and shifting in the same manner as when t=0. The similar processing then is iteratively performed in a similar manner until a time point t=m−1.

At a time point t=m, data obtained as the result of the processing B (m−1), carried out at a time point t=m−1, is written in a (m−1)st address of the memory 1-1. The above data is simultaneously entered to the check node processing device 1-2B to update the data retained by the registers.

Turning to the check node processing device 1-2A, its registers are initialized. By 'initializing' is meant that the b−1 bit length data portion corresponding to $L_v^{(1)}$ and $L_v^{(2)}$ is set to maximum values represented by the b−1 bits, while the other data portion is set to 0, as set out above. When the processing has been carried out as from the time point t=0 until a time point t=m, the processing for the 0th row block of the check matrix H of the equation [mathematical expression 1] has come to a close.

At the next time point t=m+1, the processing B(0) is again carried out. At this time, the destination of connection of the multiplexer 1-4 and that of the demultiplexer 1-5 are switched over so that the data retained by the registers of the check node processing device 1-2B are output/shifted.

At the next time point t=m+2, it is the registers of the check node processing device 1-2A that are updated and into which the result of calculations of B(0) is entered. Thus, there are output/shift and input/update modes in the check node processing devices, these modes being carried out alternately.

Viz., during the time as from time point 0 until time point m, the check node processing device 1-2B is in the input/update mode, whereas the check node processing device 1-2A is in the output/shift mode. During the time as from time point m+1 until time point 2m+1, the operation is in the opposite way around, viz., the check node processing device 1-2B is in the output/shift mode, whereas the check node processing device 1-2A is in the input/update mode.

Upon switching-over between the two modes, the destinations of connection of the permutation circuits 2-3, 2-4 of the check node processing device of FIG. 2 are also switched over, as are those of the multiplexer 1-4 and the demultiplexer 1-5, as set out above.

The above described sequence of operations is repeated until a time point t=r(m+1)−1 when the processing on the total of the row blocks of the check matrix is completed. This is equivalent to one iterative processing described above. During the time of execution of the operations from the processing B(0) up to the processing B(m−1), the total of data retained by the m registers of the check node processing device 1-2B are simply shifted on end, but are not updated.

The data retained by the registers are copied by the memory (L)1-3. However, since the same data are retained in the registers during the m time units, data may be written in the memory (L)1-3 at a time during a single time unit, or written sequentially over the m time units, as desired, thus assuring a broader degree of freedom.

By iteration of the above mentioned processing a sufficient number of times, data in the memory 1-1 is sequentially updated until the ultimate results of decoding are obtained. The sequence of readout/write addresses is the 0th address, first address, second address and so on, viz., the sequence of the natural numbers, as shown above. Thus, for example, the address generator 1-7 of FIG. 1 may simply be implemented as a clock counter.

This suggests that there is an advantage that no special device is needed for generating the addresses. As indicated by the time chart shown in FIG. 13, the destinations of connection of the multiplexer 1-4 and the demultiplexer 1-5 are switched over at a stage of processing when the readout/write addresses for the memory 1-1 have made the rounds.

The operation of the check node processing devices, shown as an example in FIG. 2, and that of the comparator circuits, shown for example in FIG. 3, will now be described. The check node processing device has the output/shift mode and the input/update mode, as set out above. These two modes are switched at a period of m time units, as shown by the timing chart of FIG. 13.

The output/shift mode consists simply of the processing of shifting data retained by each register to a neighboring register in accordance with the loop-shaped interconnection. At this time, the comparator circuits, arranged between the registers, directly output inputs from the registers without dependency upon inputs from the multiplexers.

In the input/update mode, the data retained by the registers are updated by an input from the multiplexer 1-4 of FIG. 1, and are retained by neighboring registers in accordance with the loop-shaped interconnection.

As stated in connection with the [Explanation of Formulation], the data retained by the registers are $L^{(1)}$, $L^{(2)}$, $u_{min}$ and s). These prove to be one of inputs to the comparator circuits. It is observed that $L^{(1)}$, $L^{(2)}$ are both of non-zero values, with the large/small relationship being such that $L^{(1)} \leq L^{(2)}$.

The other input from the demultiplexer is Z. The following is the operation of the comparator circuit of FIG. 3. The input Z is segmented into an upper most bit $Z_A$ and $Z_B$ composed of bits other than the above mentioned upper most bit. The bit $Z_A$ is one bit indicating the sign (plus or minus) of Z, and $Z_B$ indicates an absolute value of Z.

The upper most bit $Z_A$ is delivered to an Ex-OR circuit 3-5, along with the input s from the register. An output from the Ex-OR circuit is s'. On the other hand, $Z_B$ is delivered, along with $L^{(1)}$, $L^{(2)}$, to the comparator circuit 3-1 of FIG. 3. The smallest value among the three non-negative values $Z_B$, $L^{(1)}$ and $L^{(2)}$ is output as $L^{(1)'}$, while the second smallest value among the three non-negative values is output as $L^{(2)'}$.

The bit width of $Z_B$ is that of the absolute value part, freed of the upper most bit $Z_A$, and hence is b−1 bits. This bit width is coincident with the bit width of $L^{(1)}$ and $L^{(2)}$. Another input $u_{min}$ from the register is updated to a value, pre-set in each comparator circuit, only when $L^{(1)}$ has been replaced by the input $Z_B$. Otherwise, the input $u_{min}$ is output through as $u_{min}'$.

It is observed that the above mentioned pre-set value is a pointer that identifies one of column blocks of the check matrix. Since the number of the column blocks of the check matrix in the equation [Mathematical Expression 1] is n, the number of bits of the pre-set value is $\log_2 n$.

[Other Exemplary Embodiments of the Invention]

FIG. 4 shows a formulation including two check node processing devices of FIG. 2 arranged in parallel to each other, as, mentioned above in connection with the [Explanation of the Formulation]. By using the formulation of FIG. 4 as the check node processing device in the decoding device of FIG. 1, two time unit equivalent processing of the decoding device, the processing flow of which is shown in FIG. 12 may be performed within one time unit, thereby halving the time needed for the decoding operation. However, in this case, the number of the comparator circuits is increased in proportion to the number of parallel processing operations, as mentioned above in connection with the [Explanation of the Formulation].

FIG. 6 depicts a block diagram showing an Example of the decoding device of the present invention, in which the memory (L)1-3 has been removed. Not only the memory (L)1-3 has been removed, but the number of the addition circuits is one less than that in the decoding device shown in FIG. 1. As may be seen from FIG. 6, the formulation of the check node processing device 6-2, multiplexer 6-3 and the demultiplexer 6-4 is the same as that of the decoding device shown in FIG. 1.

In the Example shown in FIG. 12, the data portion $q_i$ in a memory 6-1, where i is an integer from 0 to nm−1, may be formed by one bit. Hence, the memory storage capacity may be of a small value of nm(b+1) bits. The memory capacity may thus be reduced in comparison with that of the decoding device of FIG. 1.

In general, the error rate characteristic is lowered by thus reducing the memory capacity. However, there are cases where, depending on selection of the check Matrix H of the equation [Mathematical Expression 1], the deterioration of the error rate characteristic may be made extremely small. If, in the decoding device of FIG. 6, the parallel formulation of the check node processing devices, shown in FIG. 4, is used, the processing for decoding may be completed within a time one-half of that needed in case of using the check node processing device of FIG. 2.

In connection with the check node processing device of FIG. 2, the number of bits of each register has been set out above as being (2b−1+ $\log_2 n$). This value is the sum of the number of bits of (b−1) for each of two data $L^{(1)}$, $L^{(2)}$, $\log_2 n$ at the maximum for a pointer $u_{min}$, in the equation [mathematical expression 4], and 1 bit for $s_v$ in the equation [mathematical expression 4]. This number of bits may, however, be of a smaller value.

The two data of $L_v^{(1)}$ and $L_v^{(2)}$ are each of b−1 bits. Viz., the number of bits of these two data is set so as to be equal to the bit width of the data portion represented by F in FIG. 12, if the sign bit representing the sign (plus or minus) is discounted. However, this is not necessarily the case and a smaller number of bits may be sufficient.

In this case, the number of bits is reduced e.g., by dividing the above input data Z to the comparator circuit of FIG. 3 by a constant as set beforehand at the time of supplying the input data to the comparator circuit of FIG. 3. For example, the above mentioned absolute value part $Z_B$, obtained by separation by the segmentation device 3-4 of FIG. 3, is shifted by one bit towards right. By this operation, which is equivalent to dividing the value by a constant 2, the number of bits may be reduced by two from one register to another.

The number of bits of the pointer is $\log_2 n$. This number of bits may be reduced by holding only lower order d bits of the pointer in the register, d being a positive number smaller than $\log_2 n$, and by truncating the remaining bits. It may sometimes occur, that the results calculated may be altered in general as a result of such reduction in the number of bits, thus deteriorating the error rate characteristic. However, there are cases where the deterioration is of an extremely small value in dependence upon selection of the check matrix of the equation [mathematical expression 1]. If the deterioration of the error rate characteristic, brought about by the reduction in the number of bits of the pointer, is that small, such reduction in the number of bits of the pointer is effective from the perspective of reducing the circuit size of the check node processing device as well as of reducing the storage capacity of the memory (L) 1-3. The specified numerical values will be stated in the Example below.

EXAMPLE

Figure 14:
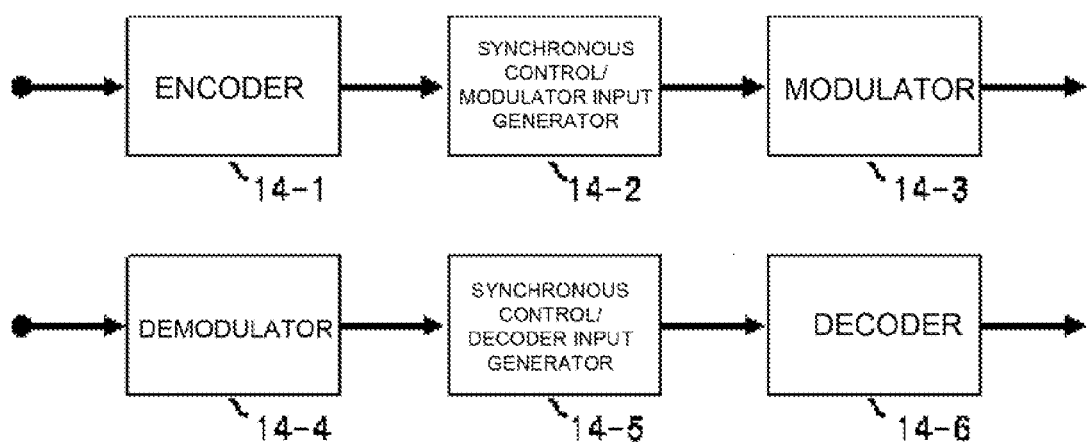
FIG. 14 is a block diagram showing an example of a data communication-storage apparatus employing the decoding device of the present invention.

FIG. 14 shows an example data communication (storage) apparatus employing a decoding device according to the present invention. The data transmission side of the present communication (storage) apparatus includes an encoder 14-1 for the low density parity check code, a synchronous control/modulator input generator 14-2 and a modulator 14-3. The synchronous control/modulator input generator 14-2 exercises control to take frame synchronization and to convert input data into data which is in keeping with the modulator.

The modulator output is delivered to a communication channel or to a storage unit. The data receiving side includes a demodulator 14-4, a synchronous control/decoder input generator 14-5 and a decoder 14-6 according to the present invention. The demodulator demodulates the information obtained from the communication channel or from the storage unit, and the synchronous control/decoder input generator performs the processing of converting the demodulator output data into input data to the decoder and of taking frame synchronization.

By way of a numerical example, when the check matrix of the equation [mathematical expression 1] is sized so that n=65, r=4 and m=63, communication may be carried out in which a bit sequence of a frame length of 4095 bits is the unit of a transmission frame. In this case, ca. 6% in one frame accounts for the redundant portion used for error correction.

In case the bit width b of each symbol constituting the input data to the decoder is 6 bits, the number of bits of each register of the check node processing device is on the order of 18 bits. Hence, the total number of bits of each register of the two check node processing devices is of the order of 2.3 Kbits. The number of RAMs may thus be reduced without significantly affecting the circuit size.

Suppose that only the lower order one bit of the pointer part in the check node processing device is held as the bit width, as set out in the [Other exemplary embodiments of the invention] in connection with the present mode, the error rate characteristic is deteriorated just by 0.1 to 0.2 dB. In case the lower order two bits are retained, the deterioration is not more than 0.1 dB. Viz., the amount of deterioration is only small. With this minor deterioration, the storage capacity of the registers of the check node processing device as well as that of the memory (L) 1-3 may be reduced by approximately 30%.

The present invention is not to be limited to the above described exemplary embodiments. Rather, the present invention may comprise a variety of alterations or corrections that may occur readily to those skilled in the art within the scope of the invention. For example, the present invention may be applied as an error correction technique for satisfying various needs in satellite communication or mobile communication, such as reduction in power consumption or reduction of the antenna size. The present invention may also be applied as an error correction technique for enhancing the reliability in a memory such as magnetic recording system. Various changes or adjustments of the exemplary embodiments and examples may be made within the framework of the disclosure of the invention inclusive of claims. Further, a wide variety of combinations or selections of disclosed elements may be made within the framework of the claims and the technical concept of the present invention. It goes without saying that the present invention encompasses a large variety of changes or corrections that may readily occur to those skilled in the art within the scope of the total disclosures inclusive of the claims.

EXPLANATION OF REFERENCE NUMERALS

| | |
|---|---|
| 1-1, 1-3, 6-1, 7-1, 7-3, 9-1 | random access memory |
| 1-2, 6-2 | check node processing device |
| 1-4, 3-2, 5-2, 5-3, 6-3, 8-4 | multiplexer |
| 1-5, 6-4 | demultiplexer |
| 1-6, 6-5 | addition circuit |
| 1-7, 1-8, 6-6 | address generator |
| 2-1, 4-1 | register |
| 2-2, 4-2 | comparator circuit |
| 2-3, 2-4, 4-3, 4-4 | permutation circuit |
| 3-1 | comparator |
| 3-3 | pointer update circuit |
| 3-4, 8-2 | separation circuit |
| 3-5, 5-4, 8-3 | Ex-OR circuit |
| 5-1, 7-5, 9-4 | adder |
| 7-2, 9-2 | check node processing circuit |
| 7-4, 9-3 | delay circuit |
| 7-6, 9-5 | permutation unit |
| 8-1 | smallest/second smallest value calculation circuit |
| 14-1 | encoder |
| 14-2 | synchronous control/modulator input generator |
| 14-3 | modulator |
| 14-4 | demodulator |
| 14-5 | synchronous control/decoder input generator |
| 14-6 | decoder |

What is claimed is:

1. A decoding device that decodes a quasi cyclic low density parity check code of an error correction encoding system, and outputs an estimated transmission bit sequence as a decoded result; comprising:
   an information memory that stores at least estimated information of a transmission bit sequence;
   a set of two feedback shift register type check node processing devices each including a feedback register made up of a plurality of registers interconnected to form a loop; said feedback shift register type check node processing devices each inputting said estimated information and generating a message to update the input estimated information and outputting the message generated;
   a multiplexer selecting one of the check node processing devices that inputs said estimated information;

a demultiplexer selecting another one of the check node processing devices that outputs said message; and an addition circuit that updates said estimated information based on said message output from said check node processing device selected by said demultiplexer to output the estimated information updated;

said check node processing device including a permutation circuit that permutates said estimated information, and a plurality of comparator circuits;

said comparator circuits each selecting, out of two data saved in the registers of the check node processing device and data output by the estimated information, a smallest value data and a second smallest value data, and saving the data selected in registers of a next stage;

each of said comparator circuits being interposed between said registers of said check node processing device.

2. The decoding device according to claim 1, further comprising:

a hysteresis memory that stores update hysteresis of said estimated information;

said addition circuit updating said estimated information based on said message output from the check node processing device as selected by said demultiplexer, and on said update hysteresis; said addition circuit outputting the estimated information updated;

said message output from said check node processing device being temporarily stored in said hysteresis memory as said update hysteresis.

3. The decoding device according to claim 1, wherein the number of said registers of said check node processing device is set so as to be equal to the size of a cyclic matrix as a component that forms a check matrix of said quasi cyclic low density parity check code.

4. The decoding device according to claim 3, wherein, if, assuming that one of said two check node processing devices is L, with the other of said two check node processing devices being R, said multiplexer that selects the check node processing device inputting the estimated information of said transmission bit sequence has selected said check node processing device L, said demultiplexer that selects the check node processing device outputting said message selects said check node processing device R; and wherein, if said multiplexer selects said check node processing device R, said demultiplexer selects said check node processing device L.

5. The decoding device according to claim 4, wherein, there are provided a plurality of said information memories;

each of said information memories, storing the estimated information of said transmission bit sequence, including a clock counter that operates in synchronism with operating readout clocks from said information memory and that is reset to 0 each time a count value reaches a preset positive value;

each of said information memories taking an address coincident with the count value of said clock counter to be a readout address;

operation of said multiplexer and said demultiplexer being changed over at a stage where address generation based on the count values of said clock counter has made a round.

6. A data communication apparatus, including a decoding device that decodes a quasi cyclic low density parity check code of an error correction encoding system, and outputs an estimated transmission bit sequence as a decoded result, the decoding device comprising:

an information memory that stores at least estimated information of a transmission bit sequence;

a set of two feedback shift register type check node processing devices each including a feedback register made up of a plurality of registers interconnected to form a loop; said feedback shift register type check node processing devices each inputting said estimated information and generating a message to update the input estimated information and outputting the message generated;

a multiplexer selecting one of the check node processing devices that inputs said estimated information;

a demultiplexer selecting another one of the check node processing devices that outputs said message; and an addition circuit that updates said estimated information based on said message output from said check node processing device selected by said demultiplexer to output the estimated information updated;

said check node processing device including a permutation circuit that permutates said estimated information, and a plurality of comparator circuits;

said comparator circuits each selecting, out of two data saved in the registers of the check node processing device and data output by the estimated information, a smallest value data and a second smallest value data, and saving the data selected in registers of a next stage;

each of said comparator circuits being interposed between said registers of said check node processing device.

7. A data storage apparatus, including a decoding device that decodes a quasi cyclic low density parity check code of an error correction encoding system, and outputs an estimated transmission bit sequence as a decoded result, the decoding device comprising:

an information memory that stores at least estimated information of a transmission bit sequence;

a set of two feedback shift register type check node processing devices each including a feedback register made up of a plurality of registers interconnected to form a loop; said feedback shift register type check node processing devices each inputting said estimated information and generating a message to update the input estimated information and outputting the message generated;

a multiplexer selecting one of the check node processing devices that inputs said estimated information;

a demultiplexer selecting another one of the check node processing devices that outputs said message; and an addition circuit that updates said estimated information based on said message output from said check node processing device selected by said demultiplexer to output the estimated information updated;

said check node processing device including a permutation circuit that permutates said estimated information, and a plurality of comparator circuits;

said comparator circuits each selecting, out of two data saved in the registers of the check node processing device and data output by the estimated information, a smallest value data and a second smallest value data, and saving the data selected in registers of a next stage;

each of said comparator circuits being interposed between said registers of said check node processing device.

* * * * *